(12) United States Patent
Lim (10) Patent No.: US 9,829,925 B2
(45) Date of Patent: Nov. 28, 2017

(54) FLEXIBLE DISPLAY APPARATUS HAVING ROLLER THAT ROTATES BY UNFOLDING OPERATION-FORCE OF USER

(71) Applicant: Youseob Lim, Goyang (KR)

(72) Inventor: Youseob Lim, Goyang (KR)

( * ) Notice: Subject to any disclaimer, the term of this patent is extended or adjusted under 35 U.S.C. 154(b) by 0 days.

(21) Appl. No.: 15/307,909

(22) PCT Filed: May 21, 2014

(86) PCT No.: PCT/KR2014/004552
§ 371 (c)(1),
(2) Date: Oct. 31, 2016

(87) PCT Pub. No.: WO2015/178518
PCT Pub. Date: Nov. 26, 2015

(65) Prior Publication Data
US 2017/0064847 A1 Mar. 2, 2017

(51) Int. Cl.
| | | |
|---|---|---|
| *G06F 1/16* | (2006.01) | |
| *G09F 9/00* | (2006.01) | |
| *G09F 9/30* | (2006.01) | |
| *H05K 5/00* | (2006.01) | |
| *H05K 5/02* | (2006.01) | |
| *H05K 5/03* | (2006.01) | |

(52) U.S. Cl.
CPC .......... *G06F 1/1652* (2013.01); *G06F 1/1626* (2013.01); *G06F 1/1637* (2013.01); *G09F 9/00* (2013.01); *G09F 9/30* (2013.01); *H05K 5/0017* (2013.01); *H05K 5/0217* (2013.01); *H05K 5/03* (2013.01); *G06F 1/1641* (2013.01)

(58) Field of Classification Search
CPC .... G06F 1/1652; G06F 1/1626; G06F 1/1637; G06F 1/1641
See application file for complete search history.

(56) References Cited

U.S. PATENT DOCUMENTS

| | | | | |
|---|---|---|---|---|
| 7,440,265 | B2* | 10/2008 | Ou Yang | G06F 1/1601 348/375 |
| 8,516,728 | B2* | 8/2013 | Jung | G09F 9/301 160/133 |
| 9,696,760 | B1* | 7/2017 | Zhang | G06F 1/1649 |
| 2002/0070910 | A1* | 6/2002 | Fujieda | G06F 1/1615 345/85 |

(Continued)

FOREIGN PATENT DOCUMENTS

| | | |
|---|---|---|
| JP | 2004-118151 A | 4/2004 |
| KR | 10-2012-0093665 A | 8/2012 |

(Continued)

*Primary Examiner* — Nidhi Thaker
(74) *Attorney, Agent, or Firm* — Patent Office of Dr. Chung Park (57) ABSTRACT

The present invention relates to a rollable flexible display apparatus to which an operation-force conversion apparatus is applied, wherein the operation-force conversion apparatus converts an unfolding or a folding operation-force linearly applied by a user to a housing of the rollable flexible display apparatus without the application of a motor or a spring into a rotation force with which a roller can rotate using the screw thread principle through an internal mechanical component, and conveys the converted rotational force to the roller.

12 Claims, 9 Drawing Sheets

(56) References Cited

U.S. PATENT DOCUMENTS

| | | | | |
|---|---|---|---|---|
| 2005/0041012 A1* | 2/2005 | Daniel | ............... | G06F 1/1601 |
| | | | | 345/156 |
| 2013/0058063 A1* | 3/2013 | O'Brien | ............ | G06F 1/1624 |
| | | | | 361/807 |
| 2016/0120022 A1* | 4/2016 | Lee | ................. | H04M 1/0268 |
| | | | | 361/749 |
| 2016/0227645 A1* | 8/2016 | Hampton | ........... | G06F 1/1601 |
| 2016/0324014 A1* | 11/2016 | Lee | .................... | H05K 1/028 |
| 2017/0023978 A1* | 1/2017 | Cho | ................... | G06F 1/1652 |

FOREIGN PATENT DOCUMENTS

| | | |
|---|---|---|
| KR | 10-2014-0001490 A | 1/2014 |
| KR | 10-2014-0017391 A | 2/2014 |
| KR | 10-2014-0059274 A | 5/2014 |

* cited by examiner

<when flexible display panel is rolled>

FIG. 1A

<when flexible display panel is changed in direction>

<protection cover upper plate omitted and unfolded state>

FIG. 2B

<protection cover upper plate omitted and folded state>

<protection cover upper plate and flexible display panel omitted and folded state>

FIG. 6B

<protection cover upper plate omitted and unfolded state>

FLEXIBLE DISPLAY APPARATUS HAVING ROLLER THAT ROTATES BY UNFOLDING OPERATION-FORCE OF USER

CROSS-REFERENCE TO PRIOR APPLICATIONS

This application is a national Stage Patent Application of PCT International Patent Application No. PCT/KR2014/004552, filed on May 21, 2014 under 35 U.S.C. §371, which is hereby incorporated by reference in its entirety.

TECHNICAL FIELD

The present invention relates to a rollable flexible display apparatus, and more particularly, to a flexible display apparatus that is provided with an operating force converter that converts an unfolding or a folding operating force linearly applied by a user when the flexible display apparatus is unfolded or folded by the user into a rotational force for a roller through the principle of a screw thread and thus transmits the converted rotational force to the roller.

BACKGROUND ART

A display has an important role in an electronic device including imaging equipment and communication equipment, and with the increment of a user' desire for portability and conveniences and the development of flexible display panel technologies, a curved flexible display, which is bendable to a given degree, has been shipped. Further, a number of prior arts related to a rollable flexible display or foldable flexible display have been recently suggested.

In case of the existing prior arts, a motor or spiral spring is just used to generate a roller's driving force necessarily needed, with which a flexible display panel is rolled. In this case, it is hard to apply the motor to the flexible display because of the miniaturization trend of the flexible display and the limitation in the battery capacity, and it is also hard to apply the spiral spring to the flexible display because of the prescription function loss of the spiral spring, the difficulty in the occupation of space, and the problem of the control in rotational force. Up to now, however, there is no appropriate suggestion capable of solving the above-mentioned problems, and accordingly, there is a definite need for the development of a new method for generating the rotational force of the roller, not through the motor or spiral spring.

DISCLOSURE

Technical Problem

Accordingly, the present invention has been made in view of the above-mentioned problems occurring in the prior art, and it is an object of the present invention to provide a flexible display apparatus that is capable of being rollable, without having any motor or spiral spring, and mechanically receiving an unfolding or a folding operating force linearly applied by a user thereto through the internal components thereof and converts the received operating force into a rotational force in a mechanical way, so that the roller provided therein is naturally rotated through mechanical engaging in accordance with the unfolding degree thereof.

It is another object of the present invention to provide a flexible display apparatus that is capable of allowing the rotational speed of a roller to be synchronized with a user's unfolding or folding speed upon the application of an unfolding or folding operating force thereto, thereby automatically maintaining the tension thereof to a given state, without having any damage on a flexible display panel thereof.

Technical Solution

To accomplish the above-mentioned objects, according to a first aspect of the present invention, there is provided a flexible display apparatus including: a bendable flexible display panel A adapted to have a screen display function; a fixing body adapted to fixedly support a portion of the flexible display panel A thereagainst; a roller A adapted to roll a freely bendable portion of the flexible display panel A and having a gear mounted on one side thereof to transmit a rotational force thereof; a protection cover A slidingly supported against the fixing body in such a manner as to allow the roller A to be rotatably assembled in the interior thereof to protect the flexible display panel A at the inside thereof; and an operating force converter adapted to convert a user's unfolding or folding operating force applied to the flexible display apparatus into a mechanical rotational force to transmit the converted rotational force to the roller A.

To accomplish the above-mentioned objects, according to a second aspect of the present invention, there is provided a flexible display apparatus including: a bendable flexible display panel B adapted to have a screen display function and having a plurality of conveying through holes linearly spaced apart from each other by a given distance to convey the flexible display panel B; a fixing body adapted to fixedly support a portion of the flexible display panel A thereagainst; a roller B having sprocket type conveying protruding parts mounted on the outside of the circumferential surface of one side end thereof in such a manner as to be continuously locked onto the conveying through holes and a gear mounted on an arbitrary center thereof to transmit a rotational force thereof; a protection cover B slidingly supported against the fixing body in such a manner as to allow the roller B to be rotatably assembled in the interior thereof to protect the portion of flexible display panel B converted in direction by means of the roller B, at the inside thereof; and an operating force converter adapted to convert a user's unfolding or folding operating force applied to the flexible display apparatus into a mechanical rotational force to transmit the converted rotational force to the roller B.

According to the present invention, desirably, the operating force converter includes: a rotation converting screw fixedly coupled to one side of the fixing body and having a through hole having a screw thread or a protruding portion performing the function of the screw thread to convert the rotational force thereof; and a rotational screw having a screw thread formed correspondingly to the screw thread or the protruding portion of the rotation converting screw on the circumferential surface from one side end positioned at the fixing body to a given range positioned at the protection cover A or the protection cover B and a first gear located on the end positioned at the protection cover A or the protection cover B to transmit the rotational force to the gear of the roller A or the gear of the roller B.

Advantageous Effects

According to the present invention, the flexible display apparatus to which the operating force converter is applied can drive the roller A or the roller B by means of the operating force converter upon the unfolding operation of the user, without having any motor, components related to the motor, and a motor controller, thereby giving some advantages such as packaging space saving, cost and weight reduction through the decrement of the number of components, and the extension of battery consumption time.

In addition, the flexible display apparatus according to the present invention can mechanically convert the unfolding or folding operating force linearly applied by the user into the rotational force of the roller by means of the operating force converter, without having any spiral spring, thereby removing the rotational force reduction caused by the prescription function loss of the spiral spring and also giving some advantages such as the easiness of packaging space occupation and the weight reduction effects obtained by the nonexistence of the spiral spring.

Further, the flexible display apparatus according to the present invention can allow the operating force converter to be mechanically synchronized with the user's unfolding speed to control the rotational speed of the roller, thereby preventing the flexible display panel A or the flexible display panel B from being torn out or damaged due to the excessive rotation of the roller A or the roller B and also preventing the flexible display panel A or the flexible display panel B from being deflected due to the insufficient rotation of the roller A or the roller B.

MODE FOR INVENTION

Hereinafter, an explanation on a flexible display apparatus according to the present invention will be in detail given with reference to the attached drawing. Objects, characteristics and advantages of the present invention will be more clearly understood from the detailed description as will be described below and the attached drawings. Before the present invention is disclosed and described, however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. In the description, it should be noted that the parts corresponding to those of the drawings are indicated by corresponding reference numerals.

Terms used in this application are used to only describe specific exemplary embodiments and are not intended to restrict the present invention. An expression referencing a singular value additionally refers to a corresponding expression of the plural number, unless explicitly limited otherwise by the context. In this application, terms, such as "comprise", "include", or "have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof. Further, the reference numerals suggested in the order of explanations are not necessarily limited by the order.

Figure 1A:
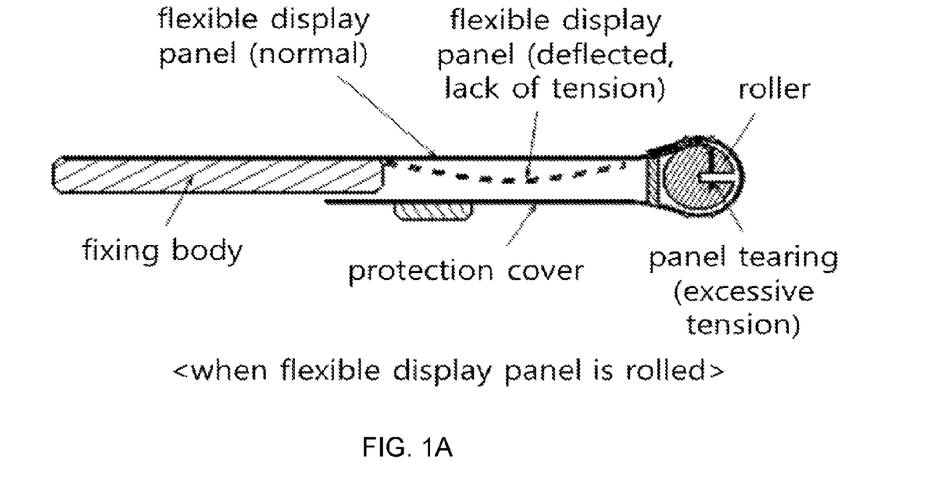
FIGS. 1a and 1b are sectional views showing a rollable flexible display apparatus in a conventional practice, wherein a flexible display panel rolled or converted in direction by means of a roller, which is accommodated in the flexible display apparatus, is torn out and deflected upon the unfolding operation of the flexible display apparatus.
Figure 1B:
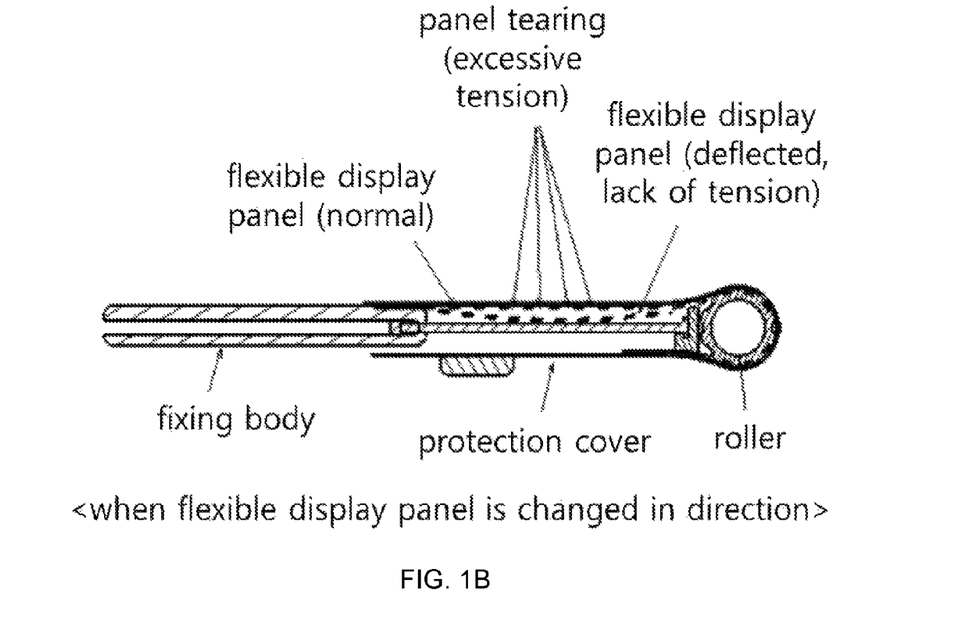
Figure 2A:
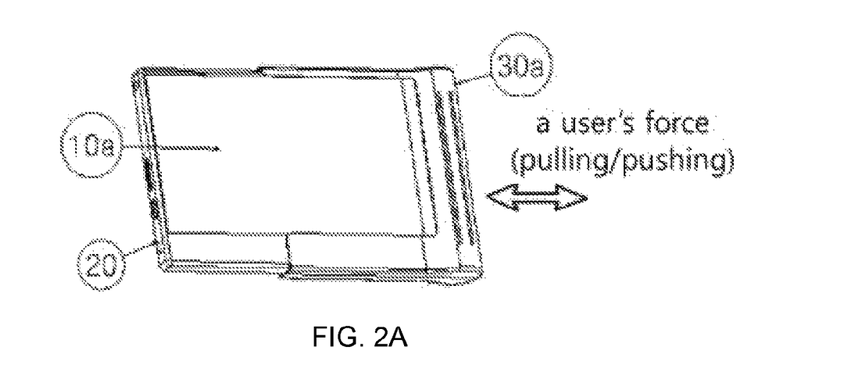
FIGS. 2a to 2d are perspective, plan and sectional views showing a rollable flexible display apparatus according to a first embodiment of the present invention, wherein the flexible display apparatus has a flexible display panel A, a fixing body, a roller A, a protection cover A and an operating force converter.
Figure 2B:
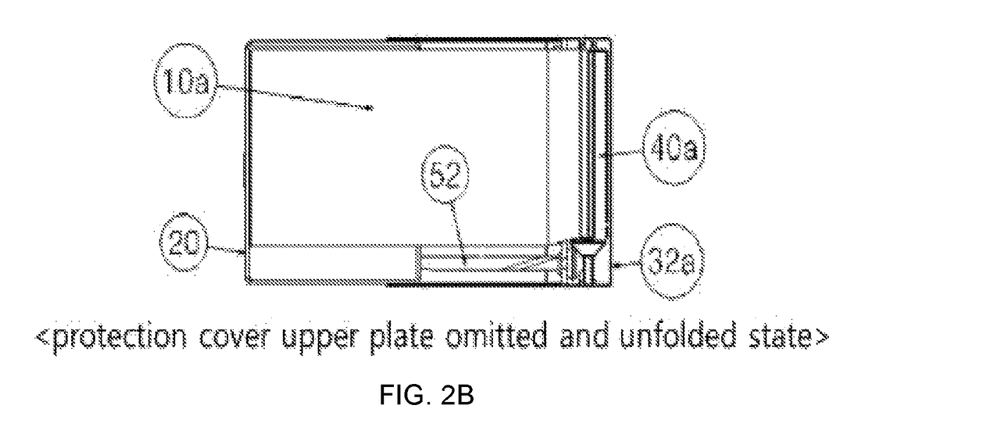
Figures 2C, 2D:
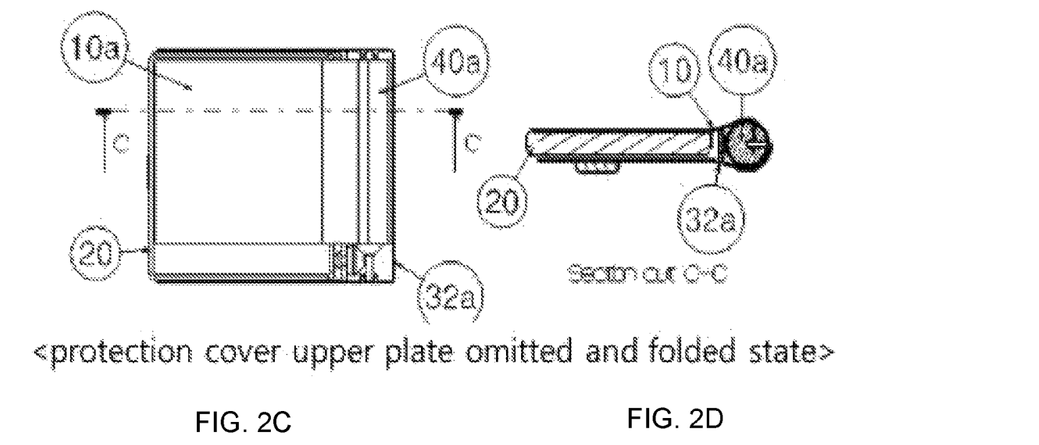

FIGS. 1a and 1b are sectional views showing a rollable flexible display apparatus in a conventional practice, wherein a flexible display panel rolled or converted in direction by means of a roller, which is accommodated in the flexible display apparatus, is torn out and deflected upon the unfolding operation of the flexible display apparatus.

Referring to roller driving ways suggested up to now in conventional flexible display apparatuses, a roller is driven by means of a motor or a spiral spring.

Driving the roller through the motor can be accurately controlled by means of the electrical control generated from a sensor, but undesirably causes some problems such as a relatively large application space, relatively high rotational torque, a relatively high manufacturing cost, and a large amount of battery capacity consumption.

Contrarily, driving the roller through the spiral spring is not accurately controlled, unlike driving the roller through the motor, but provides some advantages such as a low manufacturing cost and a small amount of battery capacity consumption. However, undesirably, driving the roller through the spiral spring causes some problems such as inaccurate driving control and torque reduction generated from the fatigue accumulation of the spiral spring.

In both of driving the roller through the motor and driving the roller through the spiral spring, as shown in FIGS. 1a and 1b, the rotation of the roller and the control of the rotational speed in the process wherein a flexible display panel is unfolded are necessarily required to prevent the flexible display panel from being damaged and to display good screens.

If the rotational speed of the roller is faster than the unfolding speed of the flexible display panel, excessive tension is generated from the flexible display panel, so that a fixed connection portion between the flexible display panel and the roller or the flexible display panel itself may be damaged.

To the contrary, if the rotational speed of the roller is slower than the unfolding speed of the flexible display panel, the flexible display panel may be deflected, so that the screen display surface may be undesirably bent.

The present invention is accordingly proposed to solve the problems the above-mentioned driving methods in the conventional practices have had, while performing accurate driving control obtained in driving the roller through the motor, and the present invention will be explained with reference to FIGS. 2a to 9.

Figure 3:
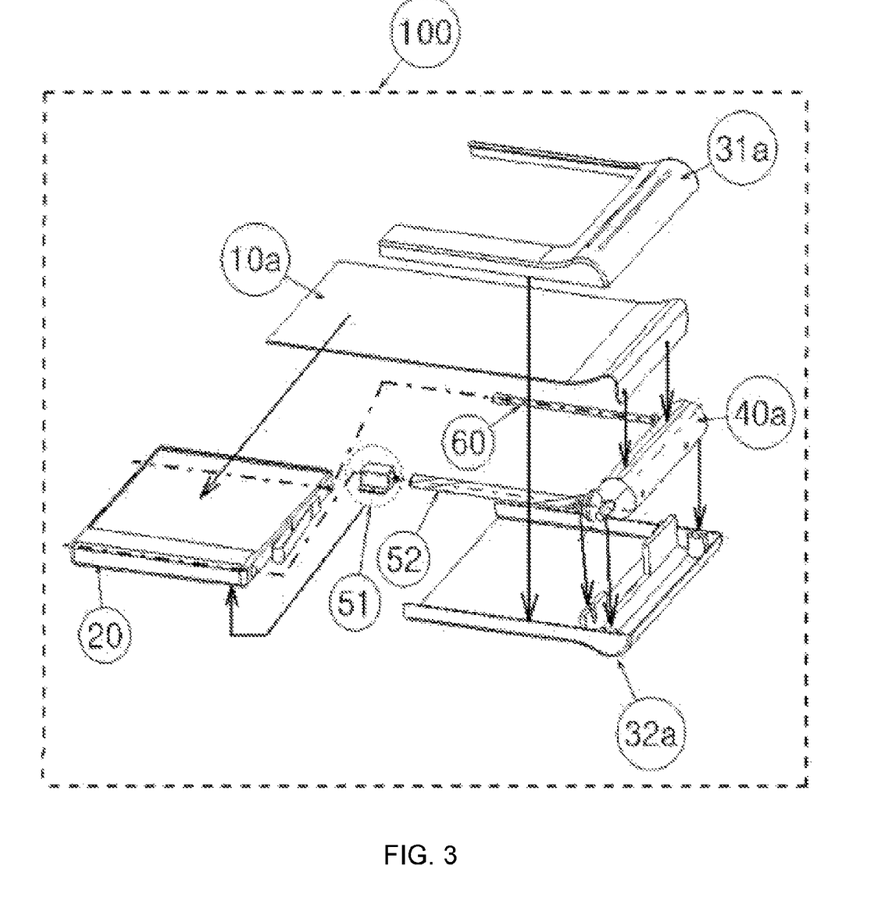
FIG. 3 is an exploded perspective view showing the rollable flexible display apparatus of FIGS. 2a to 2d.
Figure 4A:
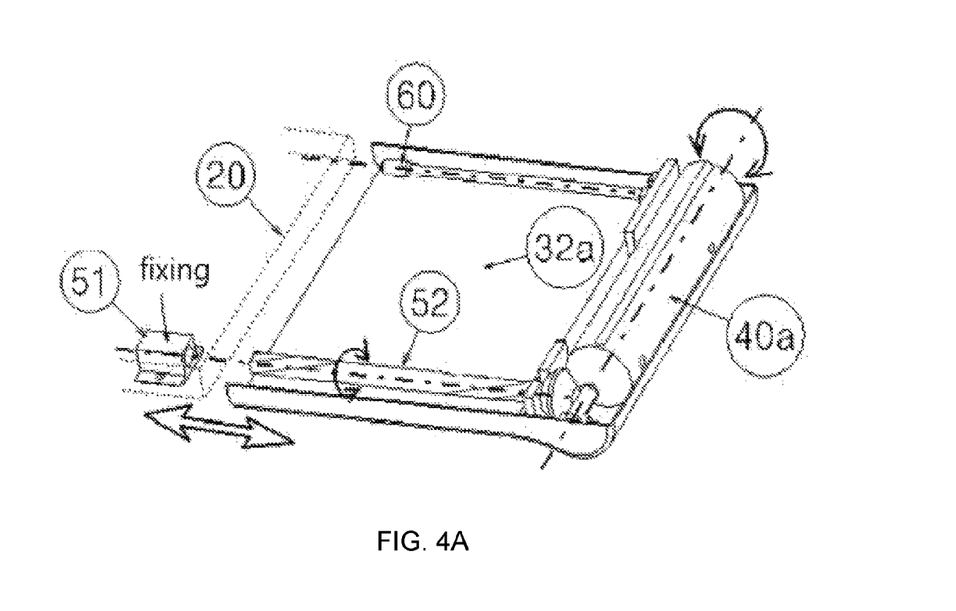
FIGS. 4a to 4c are perspective, top and sectional views showing the rotation principle of the roller A of FIGS. 2a to 2d.
Figure 4B:
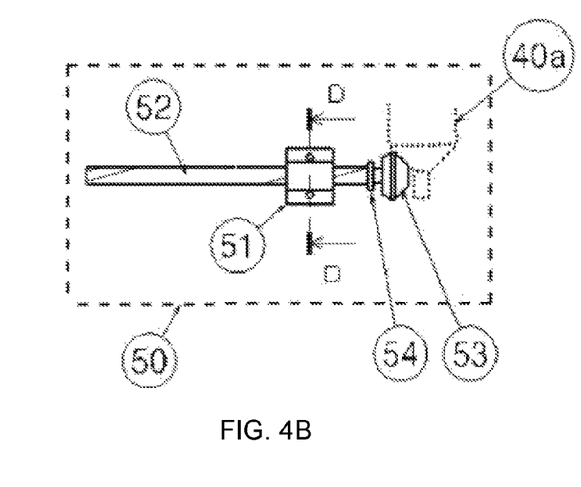
Figure 4C:
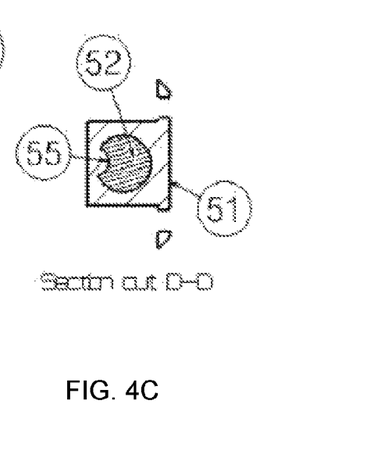
Figure 5:
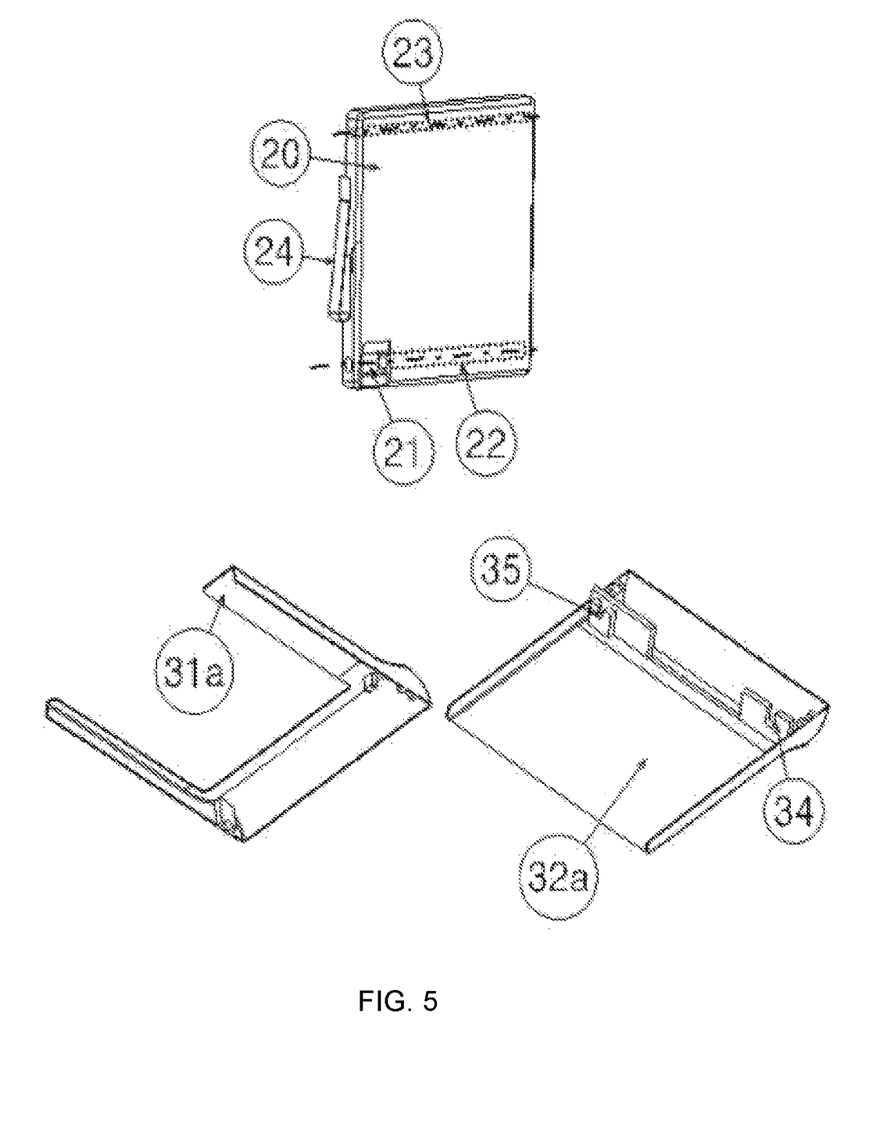
FIG. 5 is an exploded perspective view showing the fixing body, the protection cover upper plate A and the protection cover lower plate A to which the shapes for application of the operating force converter of FIGS. 2a to 2d are reflected.
Figure 6A:
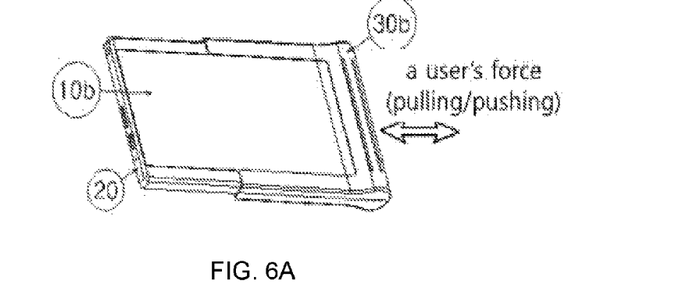
FIGS. 6a to 6d are perspective, plan and sectional views showing a rollable flexible display apparatus according to a second embodiment of the present invention, wherein the flexible display apparatus has a flexible display panel B, a fixing body, a roller B, a protection cover B and an operating force converter.
Figure 6B:
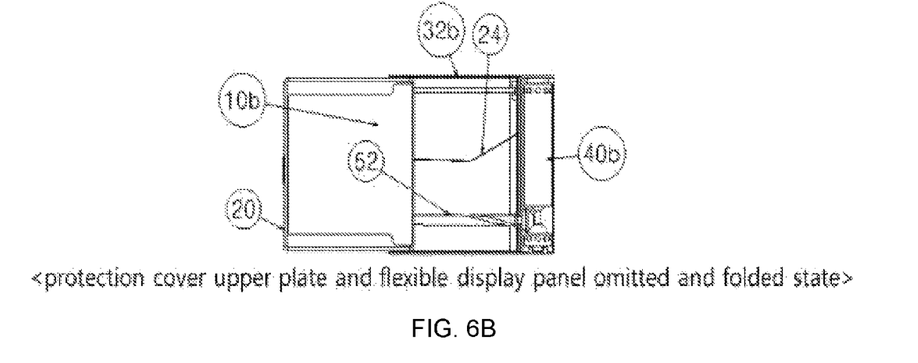
Figure 6C:
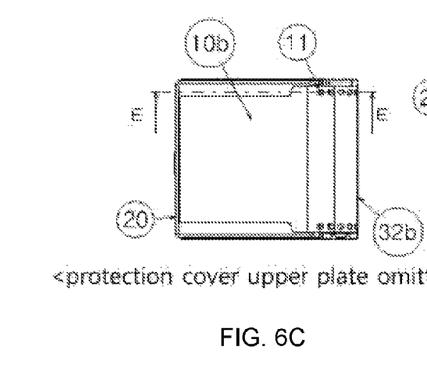
Figure 6D:
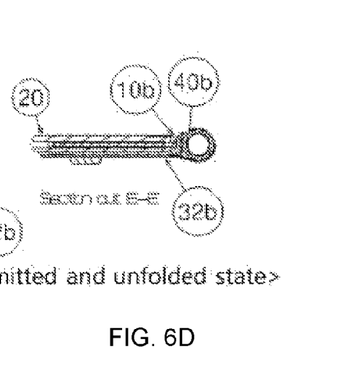
Figure 7:
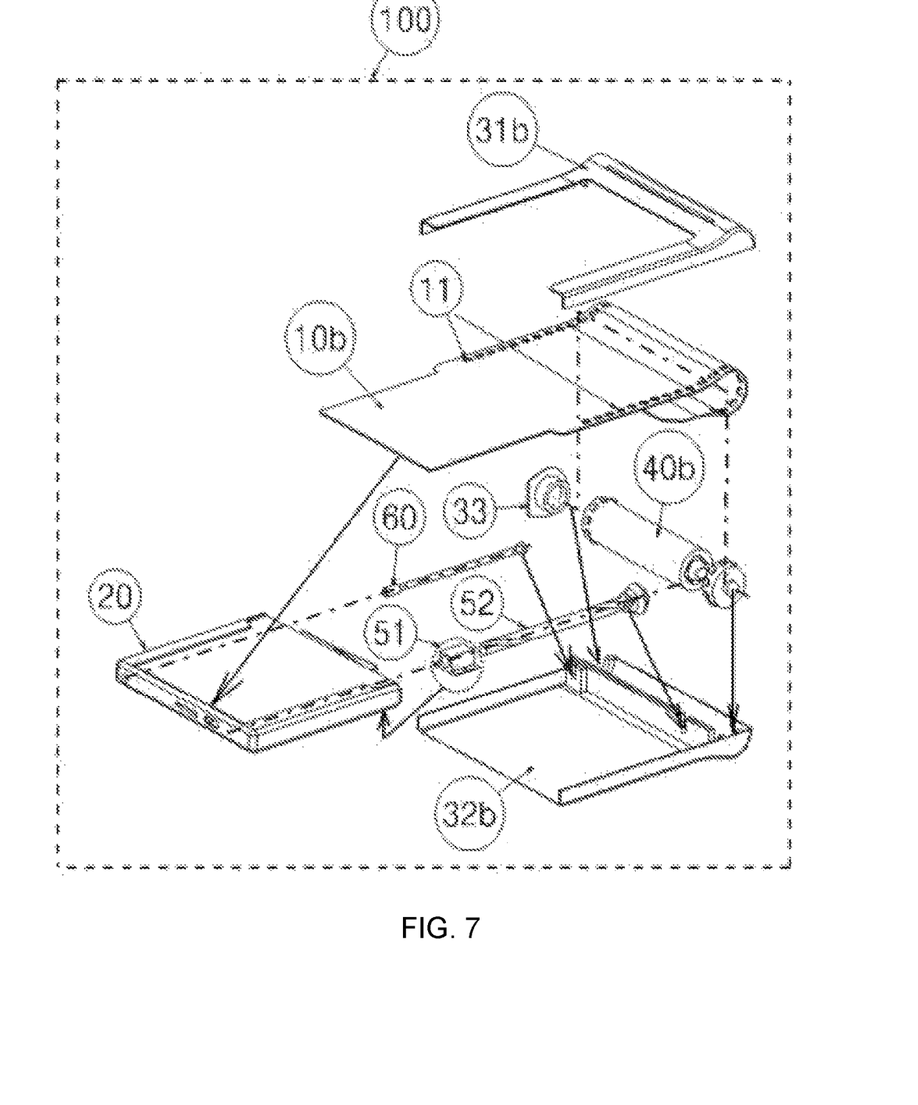
FIG. 7 is an exploded perspective view showing the rollable flexible display apparatus of FIGS. 6a to 6d.
Figure 8A:
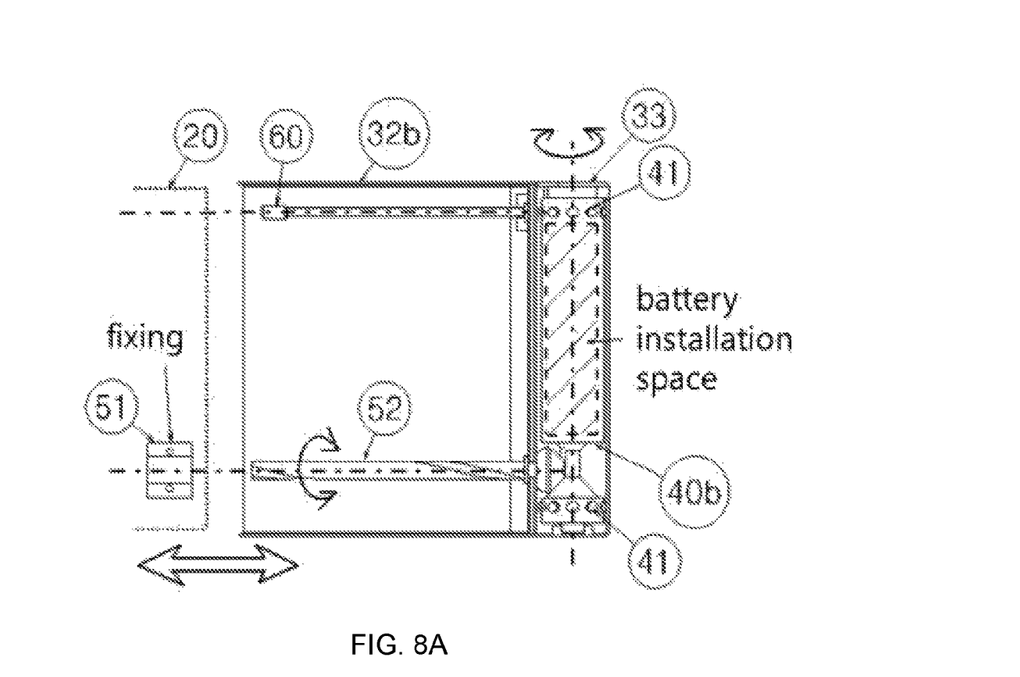
FIGS. 8a to 8c are perspective, top and sectional views showing the rotation principle of the roller B of FIGS. 6a to 6d.
Figure 8B:
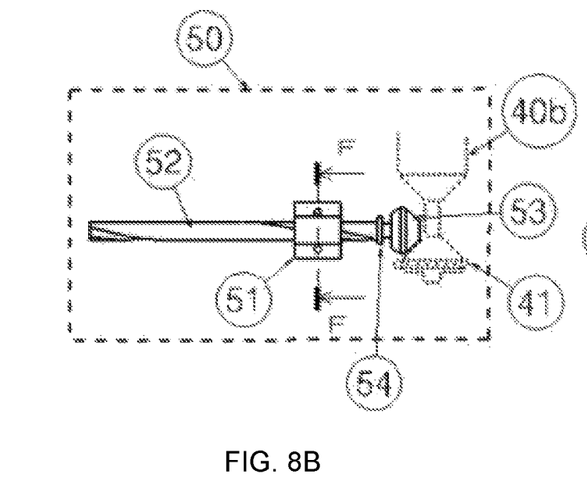
Figure 8C:
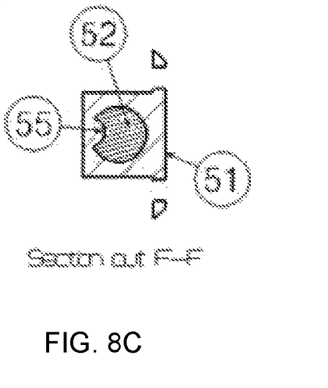
Figure 9:
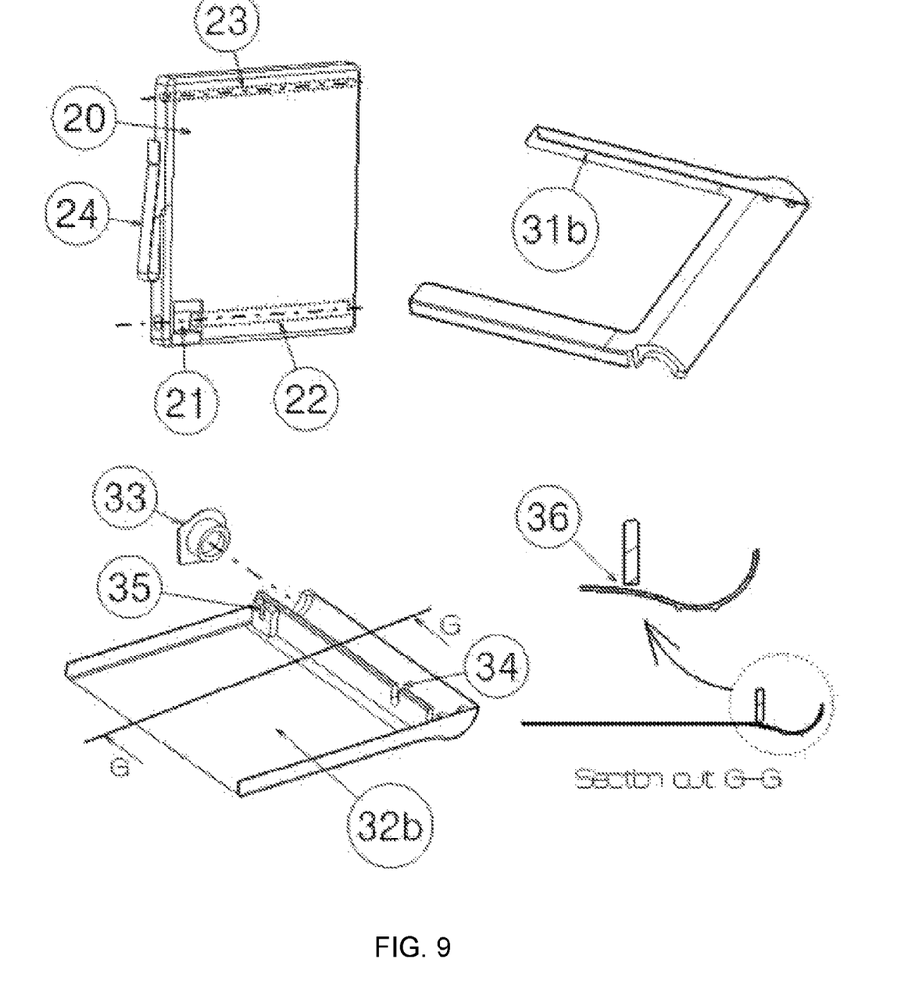
FIG. 9 is an exploded perspective view showing the fixing body, the protection cover upper plate B and the protection cover lower plate B to which the shapes for application of the operating force converter of FIGS. 6a to 6d are reflected.

FIGS. 2a to 2d are perspective, plan and sectional views showing a rollable flexible display apparatus according to a first embodiment of the present invention, wherein the flexible display apparatus has a flexible display panel A, a fixing body, a roller A, a protection cover A and an operating force converter, FIG. 3 is an exploded perspective view showing the rollable flexible display apparatus of FIGS. 2a to 2d, FIGS. 4a to 4c are perspective, top and sectional views showing the rotation principle of the roller A of FIGS. 2a to 2d, FIG. 5 is an exploded perspective view showing the fixing body, the protection cover upper plate A and the protection cover lower plate A to which the shapes for application of the operating force converter of FIGS. 2a to 2d are reflected, FIGS. 6a to 6d are perspective, plan and sectional views showing a rollable flexible display apparatus according to a second embodiment of the present invention, wherein the flexible display apparatus has a flexible display panel B, a fixing body, a roller B, a protection cover B and an operating force converter, FIG. 7 is an exploded perspective view showing the rollable flexible display apparatus of FIGS. 6a to 6d, FIGS. 8a to 8c are perspective, top and sectional views showing the rotation principle of the roller B of FIGS. 6a to 6d, and FIG. 9 is an exploded perspective view showing the fixing body, the protection cover upper plate B and the protection cover lower plate B to which the shapes for application of the operating force converter of FIGS. 6a to 6d are reflected.

Referring to FIGS. 2a to 5, a flexible display apparatus 100 according to a first embodiment of the present invention includes: a bendable flexible display panel A 10a adapted to have a screen display function; a fixing body 20 adapted to fixedly support a portion of the flexible display panel A 10a thereagainst; a roller A 40a adapted to roll a freely bendable portion of the flexible display panel A 10a and having a gear mounted on one side thereof to transmit a rotational force; a protection cover A 30a slidingly supported against the fixing body 20 in such a manner as to allow the roller A 40a to be rotatably assembled in the interior thereof to protect the flexible display panel A 10a at the inside thereof; and an operating force converter 50 adapted to convert a user's unfolding or folding operating force applied to the flexible display apparatus 100 into a mechanical rotational force to transmit the converted rotational force to the roller A 40a.

Referring to FIGS. 6a to 9, a flexible display apparatus 100 according to a second embodiment of the present invention includes: a bendable flexible display panel B 10b adapted to have a screen display function and having a plurality of conveying through holes 11 linearly spaced apart from each other by a given distance to convey the flexible display panel B 10b; a fixing body 20 adapted to fixedly support a portion of the flexible display panel A 10a thereagainst; a roller B 40b having sprocket type conveying protruding parts 41 mounted on the outside of the circumferential surface of one side end thereof in such a manner as to be continuously locked onto the conveying through holes 11 and a gear mounted on an arbitrary center thereof to transmit a rotational force thereof; a protection cover B 30b slidingly supported against the fixing body 20 in such a manner as to allow the roller B 40b to be rotatably assembled in the interior thereof to protect the portion of flexible display panel B 10b converted in direction by means of the roller B 40b, at the inside thereof; and an operating force converter 50 adapted to convert a user's unfolding or folding operating force applied to the flexible display apparatus 100 into a mechanical rotational force to transmit the converted rotational force to the roller B 40b.

As shown in FIGS. 2a to 9, the portion of the flexible display panel A 10a or the flexible display panel B 10b, which is not fixed to the fixing body 20, is rolled or converted in direction in such a manner as to be accommodatedly protected in the interior of the protection cover A 30a or the protection cover B 30b, and if necessary, it is maintained in the state of being unfolded to the form of the plane. So as to do this, the roller A 40a or the roller B 40b is driven by means of the operating force converter 50, not by means of the motor or the spiral spring as mentioned above.

As shown in FIGS. 2a to 9, the operating force converter 50 includes: a rotation converting screw 51 fixedly coupled to one side of the fixing body 20 and having a through hole having a screw thread 55 or a protruding portion performing the function of the screw thread to convert the rotational force thereof; and a rotational screw 52 having a screw thread 55 formed correspondingly to the screw thread 55 or the protruding portion of the rotation converting screw 51 on the circumferential surface from one side end positioned at the fixing body 20 to a given range positioned at the protection cover A 30a or the protection cover 30b and a first gear 53 located on the end positioned at the protection cover A 30a or the protection cover 30b to transmit the rotational force to the gear of the roller A 40a or the gear of the roller B 40b.

If the protection cover A 30a or the protection cover B 30b linearly slides by a user's force to unfold the flexible display apparatus 100, the operating force converter 50 converts the linear sliding force into the rotational force through the inverted use of screw principle. So as to convert the linear sliding force of the protection cover A 30a or the protection cover B 30b into the rotational force, the screw threads 55 are formed around the through hole formed on the center of the rotation converting screw 51 and the outer peripheral surface of the rotational screw 52, and in this case, the pitches of the screw threads 55 are relatively higher than those in general screw threads.

The number of rotation of the roller A 40a or the roller B 40b according to the linear sliding of the protection cover A 30a or the protection cover B 30b is determined upon the pitch value setting of the screw threads 55 and the gear ratio of the first gear 53 to the gear of the roller A 40a or the roller B 40b, and the rotational speed thereof is determined upon the linear sliding speed (unfolding speed) of the protection cover A 30a or the protection cover B 30b.

While the rotational force of the operating force converter 50 is being generated in association with the linear sliding of the protection cover A 30a or the protection cover B 30b, the first gear 53 may be separated from the gear of the roller A 40a or the gear of the roller B 40b to make the roller A 40a or the roller B 40b idle, which occurs when the rotational screw 52 does not have any fixed position and has a movable position from the protection cover A 30a or the protection cover B 30b. So as to prevent the roller A 40a or the roller B 40b from idling, the rotational screw 52 further includes a position fixing locking projection 54 formed thereon under the first gear 53 in such a manner as to be rotatably fixed to the inside of the protection cover A 30*a* or the protection cover B 30*b*, so that the rotational screw 52 is always kept at a given position.

As shown in FIGS. 5*a* to 9, the shapes for application of the operating force converter 50 are reflected to the fixing body 20 and the protection cover A 30*a* or the protection cover B 30*b* of the flexible display apparatus 100.

First, the fixing body 20 includes: a screw fixing portion 21 formed on one side thereof by removing a portion thereof to fix the rotation converting screw 51 thereto; and a screw accommodation portion 22 formed by removing a portion thereof to accommodate the rotational screw 52 therein according to the sliding folding of the protection cover A 30*a* or the protection cover B 30*b* toward the fixing body 20. If an electronic device or battery is applied to the protection cover A 30*a* or the protection cover B 30*b* to control the flexible display apparatus 100, there is a need for means electrically connecting the fixing body 20 and the protection cover A 30*a* or the protection cover B 30*b* with each other, and accordingly, a freely bendable connection wire 24 is disposed on one side of the fixing body 20.

The protection cover A 30*a*, which fixes the roller A 30*a* rotatably thereto, is divided into a protection cover upper plate A 31*a* and a protection cover lower plate A 32*a*, and one of the protection cover upper plate A 31*a* and the protection cover lower plate A 32*a* has a screw locking fixing portion 34 formed thereon in such a manner as to allow the position fixing locking projection 54 to be rotatably locked thereonto to maintain the given position of the rotational screw 52.

The protection cover B 30*b*, which fixes the roller B 30*b* rotatably thereto, is divided into a protection cover upper plate B 31*b*, a protection cover lower plate B 32*b*, and a protection cover side cap 33, and one of the protection cover upper plate B 31*b* and the protection cover lower plate B 32*b* has a screw locking fixing portion 34 formed thereon in such a manner as to allow the position fixing locking projection 54 to be rotatably locked thereonto to maintain the given position of the rotational screw 52 and a panel passage guide 36 formed by removing an interference portion thereof to move the flexible display panel B 10*b* direction-converted, without any interference therewith.

The protection cover side cap 33 is used for the easiness of assembling and for storing or drawing objects into or from the spare space of the roller B 40*b*.

While the flexible display apparatus 100 is being unfolded by the user's force, the protection cover A 30*a* or the protection cover B 30*b* may be escaped and separated from the fixing body 20. So as to prevent the escape of the protection cover A 30*a* or the protection cover B 30*b* from the fixing body 20, a guide sliding pin 60 is provided to have one side end having a locking projection in such a manner as to be slidingly coupled to the fixing body 20 and the opposite end to one side thereof fixed to one side of the protection cover A 30*a* or the protection cover B 30*b*. While the protection cover A 30*a* or the protection cover B 30*b* is being slidingly moved to the fixing body 20, the fixing body 20 has a sliding pin accommodation portion 23 formed by removing a portion thereof to accommodate the guide sliding pin 60 therein.

The flexible display apparatus to which the motor driving way is applied has a variety of sensors for controlling the motor so that the unfolding degree of the flexible display panel is sensed to apply an appropriate display mode to the flexible display apparatus.

According to the flexible display apparatus 100 to which the operating force converter 50 is applied, however, no sensors are mounted for controlling driving of the roller A 40*a* or the roller B 40*b*, and unless separate sensors having a limit switch are applied, the flexible display apparatus 100 cannot perform appropriate display mode conversion in accordance with the unfolding state of the flexible display panel.

So as to allow appropriate display mode conversion to be performed in accordance with the unfolding state of the flexible display panel of the flexible display apparatus 100 to which the operating force converter 50 is applied, a distance sensor (not shown) for sensing the unfolding degree is located on the fixing body 20, the protection cover A 30*a*, or the protection cover B 30*b*. Of course, the distance sensor may be located on various positions and with a variety of kinds.

According to the first and second embodiments of the present invention, the protection cover A 30*a* or the protection cover B 30*b* is disposed only in one side direction of the fixing body 20 with respect to the fixing body 20, but of course, the protection cover A 30*a* or the protection cover B 30*b* may be disposed all in both side directions of the fixing body 20 with respect to the fixing body 20, without having any change in the fundamental concepts of the functions and components thereof. Accordingly, no explanation and illustration will be suggested separately.

The rotation converting screw 51 of the operating force converter 50, which is fixedly assembled to the fixing body 20, may be formed unitarily with the fixing body 20 itself, and according to the present invention, however, the fixing body 20 and the rotation converting screw 51 formed separately from each other are proposed for the conveniences of the description and illustration of the flexible display apparatus 100 to which the operating force converter 50 is applied. Accordingly, the operating effects when the rotation converting screw 51 is formed unitarily with the fixing body 20 are the same as those when it is formed separately from the fixing body 20.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

The invention claimed is:

1. A flexible display apparatus comprising: a fixing body; a roller having a gear mounted thereon; a rotational screw having a screw thread or protruding portion rotating in a longitudinal direction thereof and a gear mounted thereon; a rotation converting screw fixed to one side of the fixing body and having a through hole formed correspondingly to the sectional shape of the rotational screw, wherein the rotational screw is located passing through the through hole of the rotation converting screw and the gear of the rotational screw is located engagedly with the gear of the roller, a protection cover having a space for accommodating the roller therein; and a screw locking fixing portion for lockingly fixing the rotational screw thereto, the rotational screw having a position fixing locking projection lockingly fixed to the screw locking fixing portion of the protection cover.

2. The flexible display apparatus according to claim 1, further comprising conveying protruding parts mounted on one side end of the roller in such a manner as to correspond to conveying through holes spaced apart from each other by a given distance along a flexible display panel.

3. The flexible display apparatus according to claim 1, wherein the rotational screw is located perpendicular to the roller.

4. The flexible display apparatus according to claim 1, further comprising: a guide sliding pin fixed to one side of the protection cover, the fixing body having a sliding pin accommodation portion for accommodating the guide sliding pin therein.

5. The flexible display apparatus according to claim 1, wherein the fixing body and the rotation converting screw are formed unitarily with each other.

6. A flexible display apparatus comprising: a roller having a gear mounted on one side thereof; a rotational screw having a gear engaged with the gear of the roller; a fixing body linearly movable in a longitudinal direction of the rotational screw; a rotation converting screw fixed to the fixing body and having a through hole formed correspondingly to the sectional shape of the rotational screw, wherein the rotational screw is located passing through the through hole of the rotation converting screw and the through hole of the rotation converting screw or the rotational screw has a screw thread or protruding portion, a protection cover having a space for accommodating the roller therein; and a screw locking fixing portion for lockingly fixing the rotational screw thereto, the rotational screw having a position fixing locking projection lockingly fixed to the screw locking fixing portion of the protection cover.

7. The flexible display apparatus according to claim 6, wherein the roller and the fixing body are connected to both ends of a flexible display panel.

8. A flexible display apparatus comprising: a protection cover; a fixing body linearly movable with respect to the protection cover; a rotation converting screw fixed to the fixing body and having a through hole having the shape of a screw thread or protruding portion; a rotational screw rotating in a longitudinal direction thereof in a sectional shape corresponding to the shape of the through hole of the rotation converting screw in such a manner as to be located passing through the through hole and having a gear rotating through the linear movement of the fixing body; a roller located at the inside of the protection cover and having a gear rotatingly engaged with the gear of the rotational screw, the protection cover having a space for accommodating the roller therein; and a screw locking fixing portion for lockingly fixing the rotational screw thereto, the rotational screw having a position fixing locking projection lockingly fixed to the screw locking fixing portion of the protection cover.

9. The flexible display apparatus according to claim 8, wherein the roller and the fixing body are connected to both ends of a flexible display panel.

10. A flexible display apparatus comprising: a fixing body; a rotation converting screw fixed to the fixing body and having a through hole having a spirally rotating screw thread or a protruding portion performing the function of the screw thread; a rotational screw insertedly coupled to the through hole of the rotation converting screw in such a manner as to be rotatably slidingly moved therealong and having a spiral portion formed spirally in an axial direction thereof to have a sectional shape corresponding to the screw thread or the protruding portion of the through hole of the rotation converting screw; a roller having a gear rotatingly engaged with a gear of the rotational screw, a protection cover having a space for accommodating the roller therein; and a screw locking fixing portion for lockingly fixing the rotational screw thereto, the rotational screw having a position fixing locking projection lockingly fixed to the screw locking fixing portion of the protection cover.

11. A flexible display apparatus comprising: a fixing body having a rotation converting screw mounted thereon, the rotation converting screw having a through hole formed thereon; a rotational screw coupled to the through hole of the rotation converting screw in such a manner as to be slidingly accommodated in the fixing body and having a gear mounted on one side thereof to transmit a rotational force; and a roller rotatably located at the outside of the fixing body and having a gear engaged with the gear of the rotational screw, a protection cover having a space for accommodating the roller therein; and a screw locking fixing portion for lockingly fixing the rotational screw thereto, the rotational screw having a position fixing locking projection lockingly fixed to the screw locking fixing portion of the protection cover.

12. A flexible display apparatus comprising: a protection cover; a roller rotating accommodatedly in the protection cover and having a gear adapted to receive a rotational force; a rotational screw rotatingly engaged with the gear of the roller and having a screw thread or protruding portion rotating in a longitudinal direction thereof; and a rotation converting screw having a through hole formed correspondingly to the sectional shape of the rotational screw, wherein the rotational screw is located passing through the through hole of the rotation converting screw, the protection cover having a space for accommodating the roller therein; and a screw locking fixing portion for lockingly fixing the rotational screw thereto, the rotational screw having a position fixing locking projection lockingly fixed to the screw locking fixing portion of the protection cover.

\* \* \* \* \*